United States Patent
Kuo et al.

(10) Patent No.: US 8,598,625 B2
(45) Date of Patent: Dec. 3, 2013

(54) ESD PROTECTION DEVICE WITH TUNABLE DESIGN WINDOWS

(75) Inventors: Hsi-Yu Kuo, Hsin-Chu (TW); Jam-Wem Lee, Zhubei (TW); Yi-Feng Chang, Xinbei (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 182 days.

(21) Appl. No.: 13/091,468

(22) Filed: Apr. 21, 2011

(65) Prior Publication Data
US 2012/0168906 A1    Jul. 5, 2012

Related U.S. Application Data

(60) Provisional application No. 61/428,401, filed on Dec. 30, 2010.

(51) Int. Cl.
*H01L 29/73* (2006.01)

(52) U.S. Cl.
USPC ............... 257/173; 257/355; 257/E29.174; 257/E29.187

(58) Field of Classification Search
USPC ............... 257/173, 355, E29.174, E29.187
See application file for complete search history.

(56) References Cited

U.S. PATENT DOCUMENTS

| | | | | |
|---|---|---|---|---|
| 7,732,834 B2 * | 6/2010 | Russ et al. | | 257/173 |
| 8,049,250 B2 * | 11/2011 | Song et al. | | 257/173 |
| 8,217,494 B2 * | 7/2012 | Chen | | 257/577 |
| 2010/0127305 A1 * | 5/2010 | Renaud et al. | | 257/111 |

* cited by examiner

*Primary Examiner* — Minh-Loan T Tran
(74) *Attorney, Agent, or Firm* — Slater & Matsil, L.L.P.

(57) ABSTRACT

An electrostatic discharge (ESD) device includes a high-voltage well (HVW) region of a first conductivity type; a first heavily doped region of a second conductivity type opposite the first conductivity type over the HVW region; and a doped region of the first conductivity type contacting the first heavily doped region and the HVW region. The doped region is under the first heavily doped region and over the HVW region. The doped region has a first impurity concentration higher than a second impurity concentration of the HVW region and lower than a third impurity concentration of the first heavily doped region. The ESD device further includes a second heavily doped region of the second conductivity type over the HVW region; and a third heavily doped region of the first conductivity type over and contacting the HVW region.

21 Claims, 8 Drawing Sheets

ESD PROTECTION DEVICE WITH TUNABLE DESIGN WINDOWS

This application claims the benefit of U.S. Provisional Application No. 61/428,401 filed on Dec. 30, 2010, entitled "ESD Protection Device with Tunable Design Windows," which application is hereby incorporated herein by reference.

BACKGROUND

Electrostatic Discharge (ESD) is a known problem in the manufacturing and the using of integrated circuits. Typically, transistors have thin oxides and insulating layers that can be damaged by ESD events, and special care is required to protect the integrated circuits from the damage caused by the ESD events.

Various devices have been used as ESD devices. For example, Resistor-Capacitor Metal-Oxide-Semiconductor (RC-MOS) devices were extensively used for the purpose of ESD protection. During the occurrence of ESD events, an RC-MOS device is biased such that the ESD current is shunted by the MOS transistor in the RC-MOS device, which MOS transistor works at an active MOS conduction mode. The MOS device is turned off during normal operations when no ESD transient occurs. Many configurations were adopted to tune the behavior of the RC-MOS devices, such as the timing, the boosted bias, the false trigger prevention ability, etc. The design of the ESD devices based on RC-MOS devices, however, is not straight forward, and large chip-area consumption is required. In addition, the RC-MOS devices may be triggered in error by the fluctuation in power supply.

Breakdown-mode devices such as MOS transistors, bipolar junction transistors (BJTs), and silicon-controlled rectifiers (SCRs) were also used as ESD devices since their It2 currents are high. It2 currents are measures of the ESD devices' ability to carry currents during the ESD events. Accordingly, the chip areas required for forming breakdown-mode devices are small, and the corresponding leakage currents are low. For example, a conventional ESD device may be formed of a BJT, which includes a high-voltage n-well (HVNW) region, a base pick-up region (an N+ region), a collector (a P+ region), and an emitter (a P+ region), wherein the base pick-up, the collector, and the emitter are formed over and contacting the HVNW region. The base pickup region and the HVNW region form the base of the BJT.

The breakdown-mode devices, however, typically have fixed design windows, which are the windows defined by the holding voltages and the triggering voltages of the ESD devices. The design windows were determined by process conditions and are difficult to adjust. For example, exemplary BJT devices may be used for the protection of a circuit having a VDD smaller than 15V and a breakdown voltage greater than 20V. These BJT devices, however, cannot be used for the circuits having a VDD voltage equal to 16V and a breakdown voltage equal to 21V. The fixed design window posts a problem for a chip having several circuits requiring different holding voltages and the triggering voltages.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel Electrostatic Discharge (ESD) device comprising a bipolar junction transistor (BJT) is provided in accordance with an embodiment. The variations and the operation of the embodiment are then discussed. Throughout the various views and illustrative embodiments, like reference numbers are used to designate like elements.

Figure 1A:
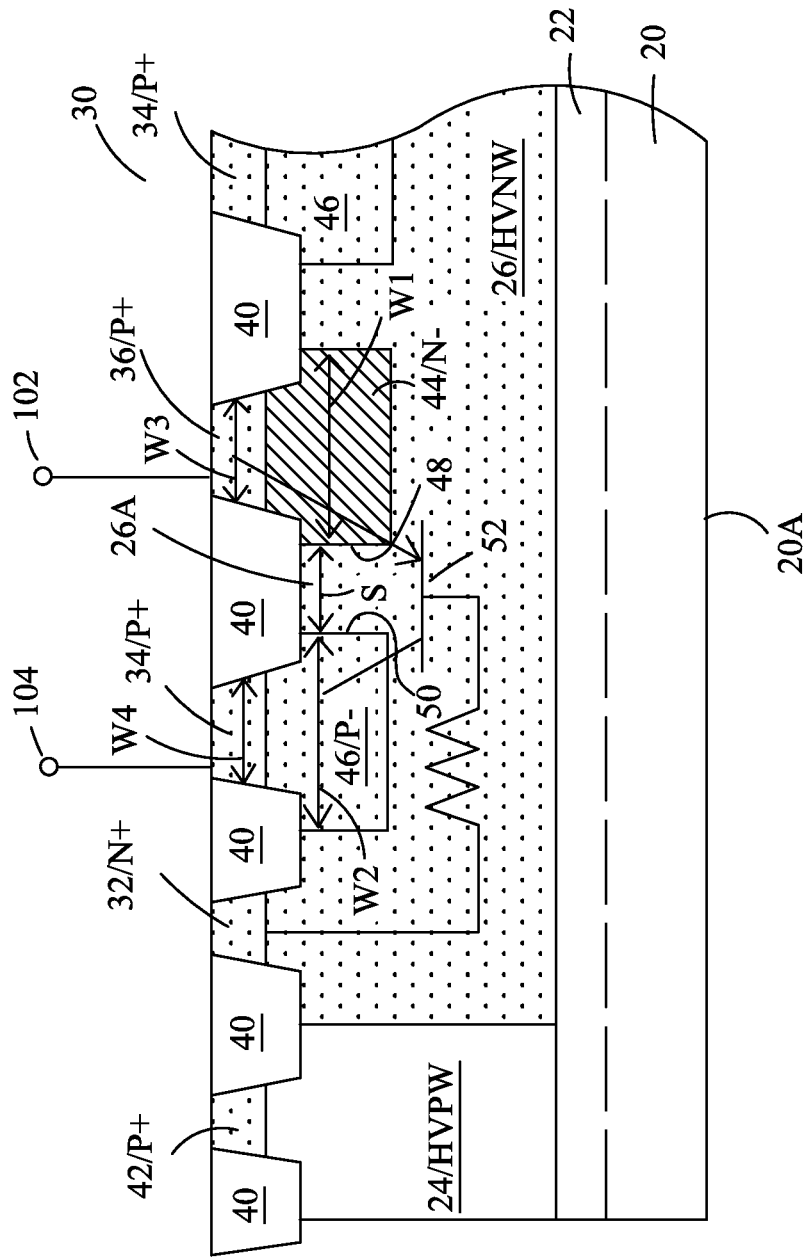
FIGS. 1A through 1C illustrate cross-sectional views of Electrostatic Discharge (ESD) devices comprising bipolar junction transistors (BJTs) in accordance with various embodiments.

FIG. 1A illustrates a cross-sectional view of ESD device 30 in accordance with an embodiment, wherein ESD device 30 includes PNP BJT 52. ESD device 30 is formed over substrate 20. In an embodiment, substrate 20 is a semiconductor substrate, which may be a silicon substrate, a silicon carbon substrate, or the like. Substrate 20 may be lightly doped with a p-type impurity (and hence may sometimes referred to as being a p-sub), although it may be doped with an n-type impurity. Optionally, n-type buried layer (NBL) 22 may be formed over substrate 20. NBL 22 has an impurity concentration higher than the impurity concentration of substrate 20.

High-Voltage P-Well (HVPW) 24 and High-Voltage N-Well (HVNW) 26 are formed over substrate 20 and the optional NBL or deep N-well (DNW) 22. In an exemplary embodiment, HVPW 24 has a net p-type impurity concentration between about $10^{15}/cm^3$ and about $10^{17}/cm^3$, and/or HVNW 26 has a net n-type impurity concentration between about $10^{15}/cm^3$ and about $10^{17}/cm^3$. One skilled in the art will realize, however, that the values recited throughout the description are examples, and may be changed in different embodiments.

BJT 52 includes base pick-up region 32, which may be a heavily doped n-type region, and collector 34 and emitter 36, which are heavily doped p-type regions. In the described embodiments, the term "heavily doped" means an impurity concentration above about $10^{19}/cm^3$. One skilled in the art will recognize, however, that heavily doped is a term of art that depends upon the specific device type, technology generation, minimum feature size, and the like. It is intended, therefore, that the term be interpreted in light of the technology being evaluated and not be limited to the described embodiments. Collector 34 and emitter 36 may be formed simultaneously, and hence may be at a same level, have a same concentration, and/or may extend down to substantially a same depth. Base pick-up region 32, collector 34, and emitter 36 may be spaced apart from each other by isolation regions 40, which may be shallow trench isolation (STI) regions. HVPW 24 may form a ring surrounding BJT 52 (also refer to FIGS. 2A and 2B), and electrically isolates BJT 52 from external devices. P-type ring 42, which may be a heavily doped p-type region, may be formed at a top surface of HVPW 24.

N− region (a moderately doped n-type region) 44 is formed under emitter 36, with at least a portion of N− region 44 vertically overlapping at least a portion, and possibly an entirety, of emitter 36. Furthermore, the top surface of N− region 44 contacts the bottom surface of emitter 36. N− region 44 may, or may not, extend to directly under and vertically overlapping a portion of the neighboring STI regions 40. N− region 44 has a net n-type impurity concentration higher than the n-type impurity concentration of HVNW 26. In an exemplary embodiment, a ratio of the n-type impurity concentration of N− region 44 to the impurity concentration of HVNW 26 is greater than about 5, or greater than about 10, 20, or even about 100. Furthermore, the n-type impurity concentration of N− region 44 is lower than the impurity concentrations of emitter 36 and collector 34. In an exemplary embodiment, a ratio of the impurity concentration of N− region 44 to the impurity concentration of emitter 36 is smaller than about 1/5, or smaller than about 1/10, 1/20, or even about 1/100. HVNW 26 includes region 26A, which has a side edge forming interface 48 with a side edge of N− region 44, and the impurity concentration of N− region 44 is also greater than that of region 26A. Interface 48 may be substantially perpendicular to major surfaces of substrate 20, such as surface 20A.

Optionally, P− region (a moderately doped p-type region) 46 is formed under collector 34, with at least a portion of P− region 46 vertically overlapping at least a portion, and possibly an entirety, of collector 34. P− region 46 may space HVNW 26 apart from collector 34. Furthermore, the top surface of P− region 46 contacts the bottom surface of collector 34. N− region 44 and P− region 46 may be at substantially a same level. P− region 46 may, or may not, extend to directly under the neighboring STI regions 40. P− region 46 has a net p-type impurity concentration higher than the n-type impurity concentration of HVNW 26. In an exemplary embodiment, a ratio of the p-type impurity concentration of P− region 46 to the n-type impurity concentration of HVNW 26 is greater than about 5, or greater than about 10, 20, or even 100. Furthermore, the p-type impurity concentration of P− region 46 is lower than the impurity concentrations of collector 34 and emitter 36. In an exemplary embodiment, a ratio of the p-type impurity concentration of P− region 46 to the impurity concentration of collector 34 is smaller than about 1/5, or smaller than about 1/10, about 1/20, or even about 1/100. HVNW 26 includes region 26A, which has a side edge forming interface 50 with a side edge of P− region 46, and the impurity concentration of P− region 46 is also greater than that of region 26A of HVNW 26. Interface 50 may be substantially perpendicular to major surfaces of substrate 20, such as surface 20A.

Figure 3:
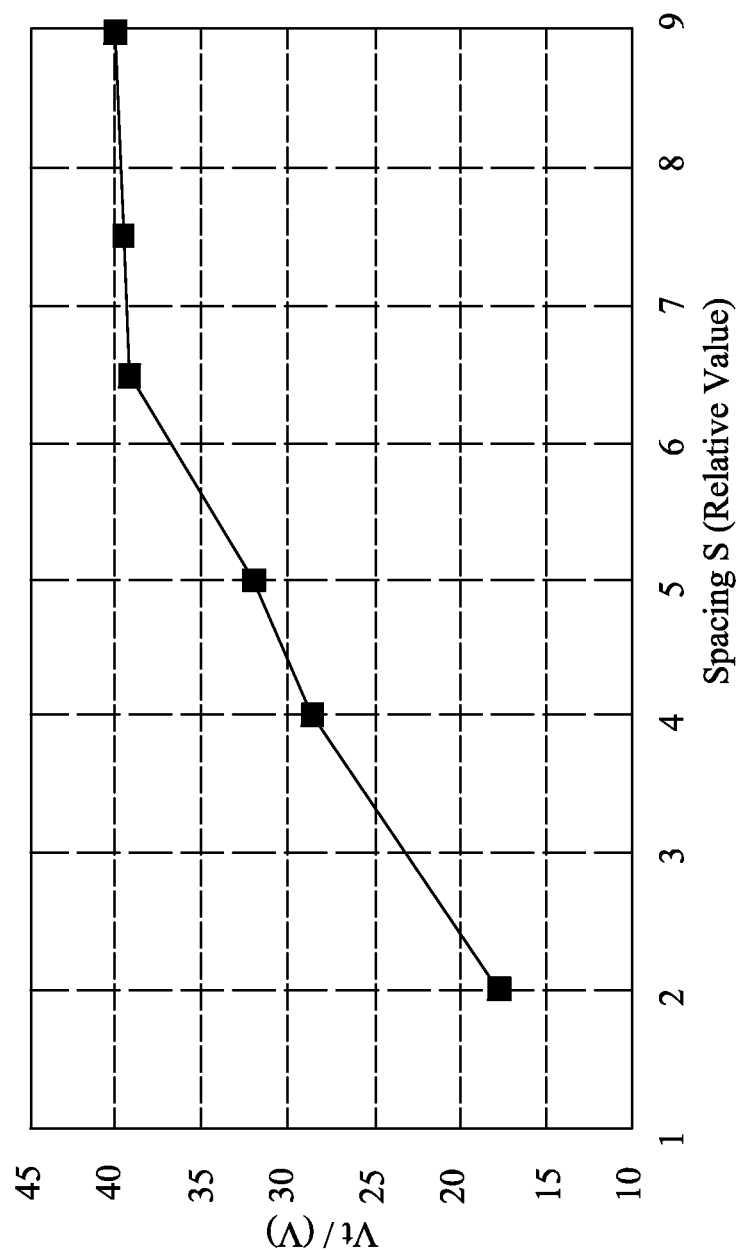
FIG. 3 illustrates triggering voltages of the ESD devices as a function of the spacing between the moderately doped regions under collectors and emitters.

Horizontal spacing S between interfaces 48 and 50 affects the performance of ESD device 30, wherein spacing S is measured in a direction parallel to a major surface (such as surface 20A) of substrate 20. FIG. 3 illustrates the simulation results that reveal the relationship between triggering voltage Vt1 of ESD device 30 and spacing S, wherein spacing S is a relative value. The triggering voltage Vt1 is the voltage at which ESD device 30 breaks down to conduct ESD currents. It is observed that with the increase in spacing S, triggering voltage Vt1 increases. Although not illustrated, holding voltages of ESD device 30 follow the similar trend as that of triggering voltage Vt1, and with the increase in spacing S, the holding voltage increases.

Figure 4:
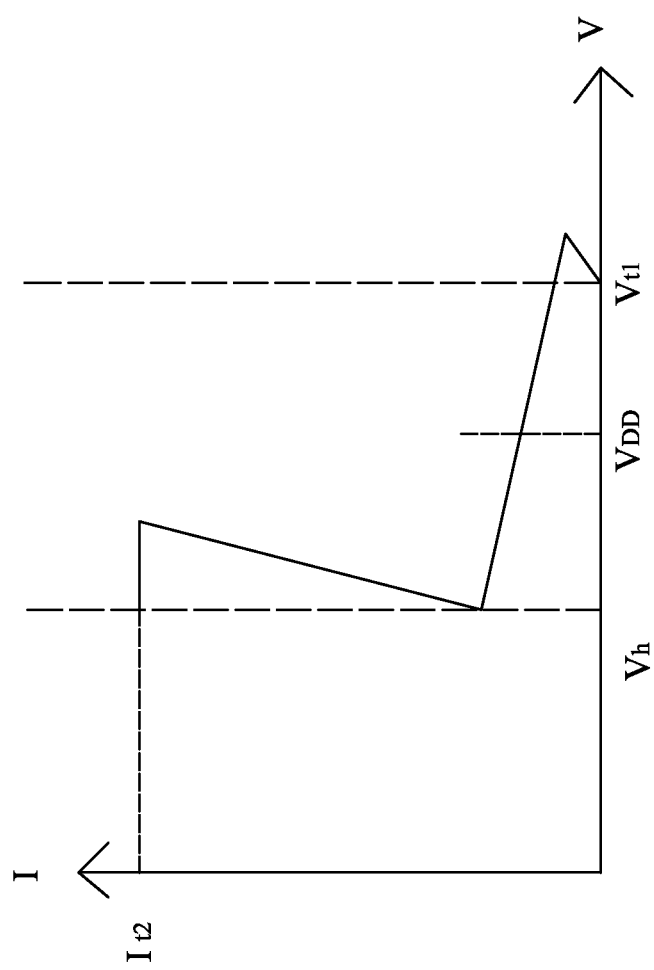
FIG. 4 schematically illustrates a design window of an ESD device.

FIG. 4 illustrates a schematic illustration of the holding voltage Vh and triggering voltage Vt1. According to FIG. 3, increasing spacings S for the ESD devices may cause the corresponding design window (the window between holding voltage Vh and triggering voltage Vt1) to shift to higher voltages, and reducing spacings S for the ESD devices may cause the corresponding design window to shift to lower voltages. If two circuits in the same chip require different design windows to suit to different power supply voltages VDD and different breakdown voltages of the respective internal circuits, then two ESD devices 30 may be formed on the same chip, with spacings S of two ESD devices 30 be adjusted to different values.

N− region 44 may be formed by implanting into HVNW 26. Further, N− region 44 may be formed simultaneously with the formation of the N− regions of other devices in the same chip, such as the N− regions of low-voltage devices. P− region 46 may also be formed by implanting into HVNW 26, and may be formed simultaneously with the formation of the P− regions of other devices in the same chip, such as the P− regions of low-voltage devices. Accordingly, no additional process steps and no additional cost are needed for forming N− region 44 and P− region 46.

Figure 1B:
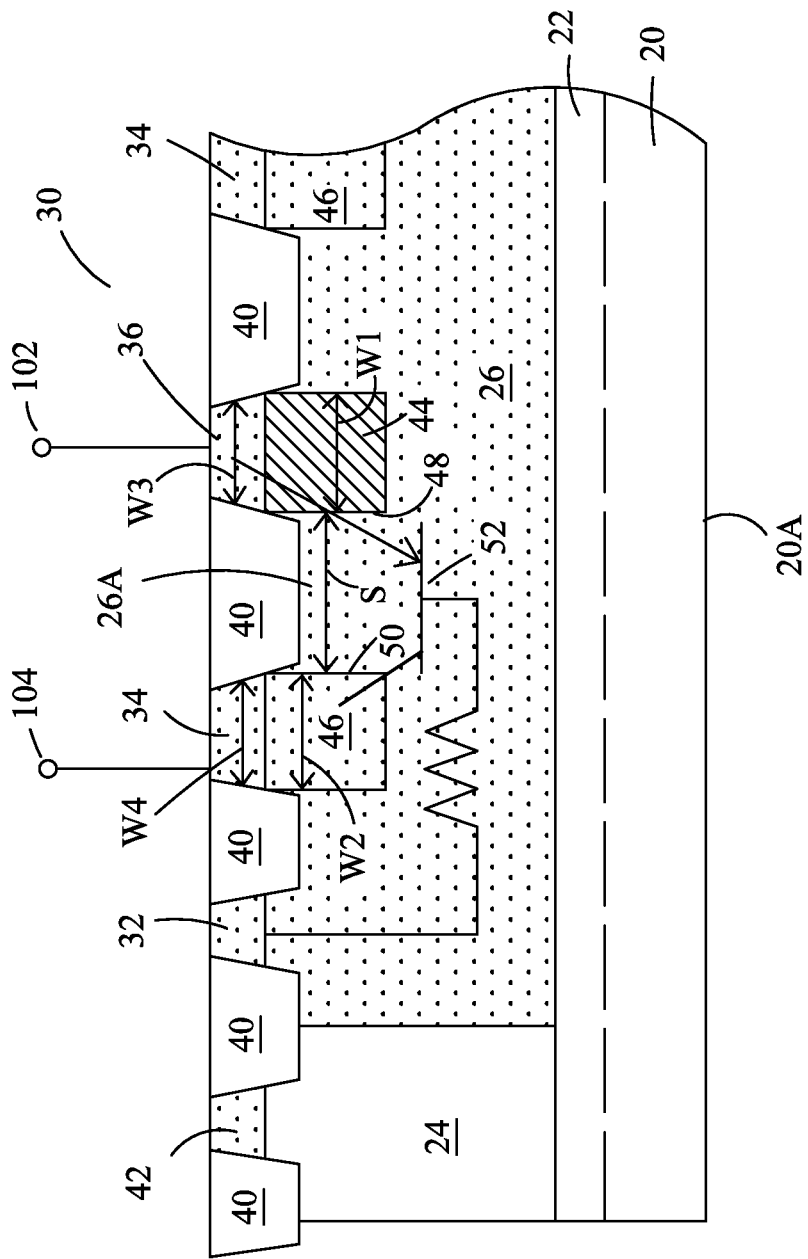
Figure 1C:
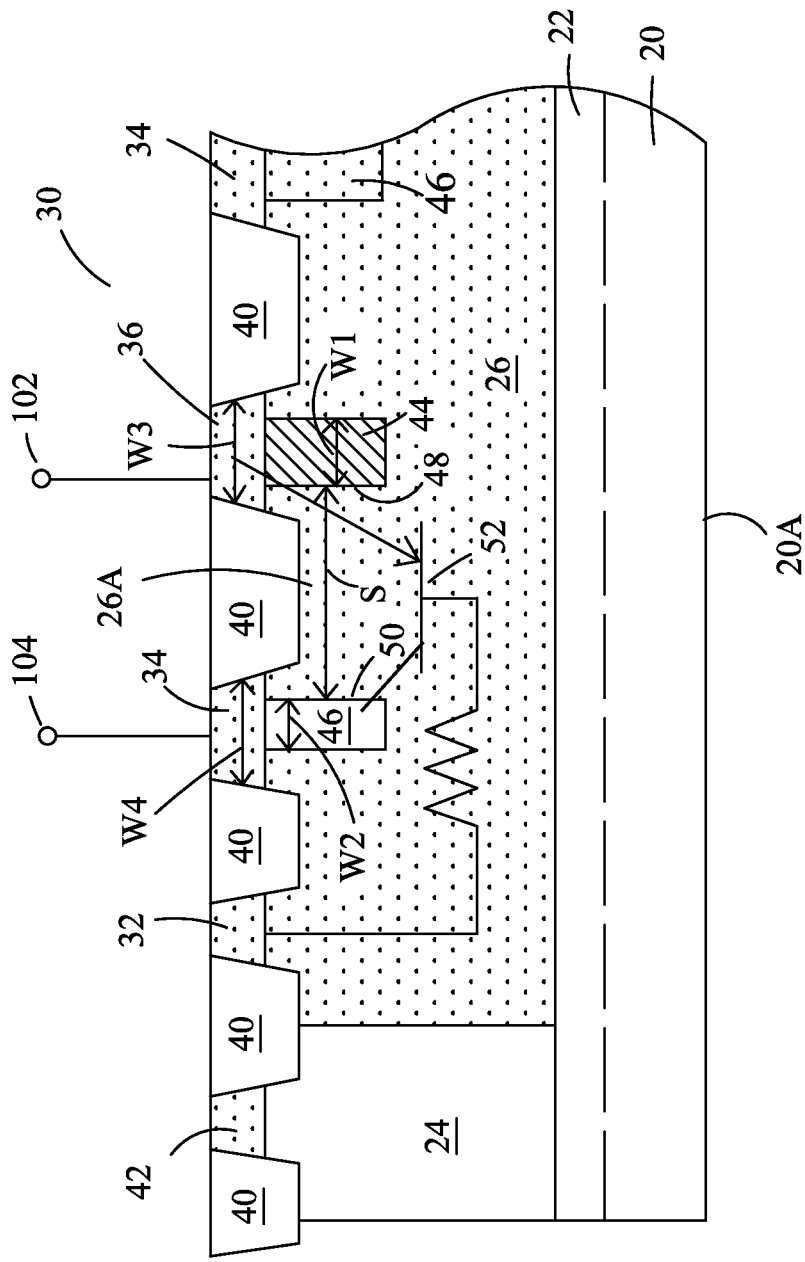

In FIG. 1A, N− regions 44 and P− region 46 extend to directly underlying the neighboring STI regions 40. Accordingly, the horizontal dimensions W1 and W2 of N− region 44 and P− region 46 are greater than the respective horizontal dimensions W3 and W4 of the respective overlying emitter 36 and collector 34. FIGS. 1B and 1C illustrate alternative embodiments. In FIG. 1B, the edges of N− region 44 and P− region 46 are aligned to the side edges of the respective emitter 36 and collector 34. Accordingly, the horizontal dimensions W1 and W2 of N− region 44 and P− region 46 are substantially equal to the respective horizontal dimensions W3 and W4 of the respective overlying emitter 36 and collector 34. In FIG. 1C, the horizontal dimensions W1 and W2 of N− region 44 and P− region 46 are smaller than the respective dimensions W3 and W4 of the respective overlying emitter 36 and collector 34. Accordingly, N− region 44 and P− region 46 vertically overlap portions, but not all, of the respective overlying emitter 36 and collector 34.

Figure 2A:
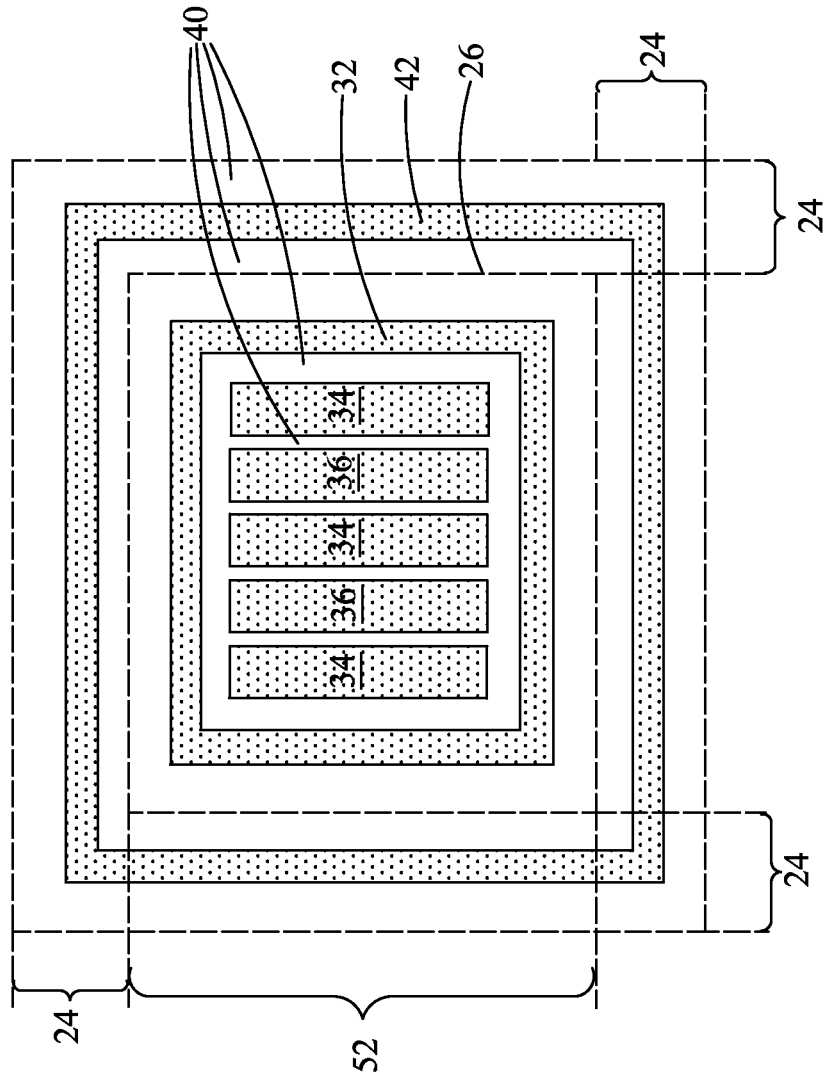
FIGS. 2A and 2B illustrate top views of exemplary ESD devices comprising BJTs.
Figure 2B:
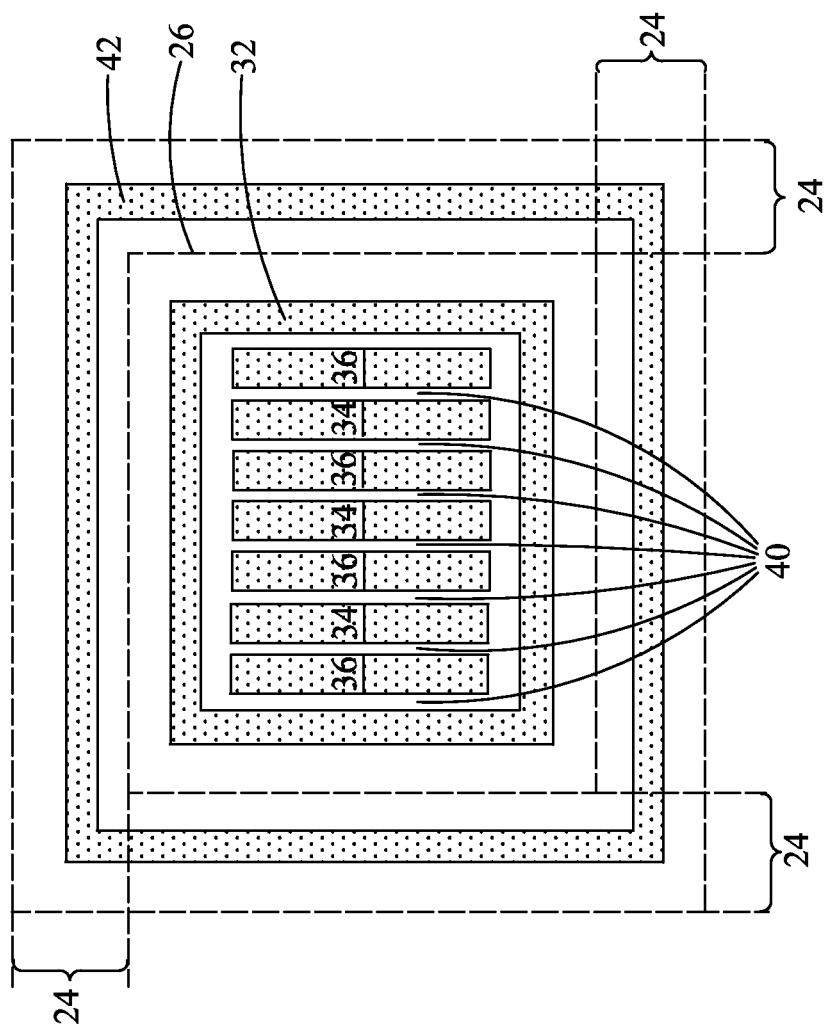

ESD device 30 may have various designs with different top views. For example, FIG. 2A illustrates a top view in accordance with an embodiment. Collectors 34 (which are interconnected to each other) and emitters 36 (which are interconnected to each other) of the same ESD device 30 include parallel strips placed in an alternating pattern. In this exemplary embodiment, the outmost strips near base 32 are collectors 34, and base pick-up region 32 may form a ring encircling collector strips 34 and emitter strips 36. In alternative embodiments, as shown in FIG. 2B, the outmost strips near base 32 are emitters 36. The performance of the embodiment in which the outmost strips are collectors 34 may be essentially the same as the embodiments in which the outmost strips are emitters 36. Furthermore, HVPW 24 may form another ring encircling base pick-up region 32. In alternative embodiments (not shown), collector 34 may form a ring encircling emitters 36 or emitter 36 may form a ring encircling collector 34, and base pick-up region 32 may form another ring encircling the ring formed of collector 34 or emitter 36. Again, HVNW 26 may be encircled by the ring formed of HVPW 24.

Referring again back to FIGS. 1A through 1C, for ESD device 30 to function as a power ESD clamp, emitter 36 may be connected to a first power supply line such as a VDD power supply line, which is shown as 102, and collector 34 may be connected to a second power supply line such as a VSS line, which is shown as 104. The first power supply line 102 may have a voltage higher than the voltage of second power supply line 104. For the ESD device to function as a pull-down ESD clamp, emitter 36 may be connected to a input/output pad, which is also schematically shown as 102, and collector 34 may be connected to power supply line such as a VSS line, which is shown as node 104. For ESD device to function as a pull-up ESD clamp, emitter 36 may be connected to a power supply line such as a VDD line, which is also schematically shown as 102, and collector 34 may be connected to an input/output pad, which is shown as node 104.

Figure 5:
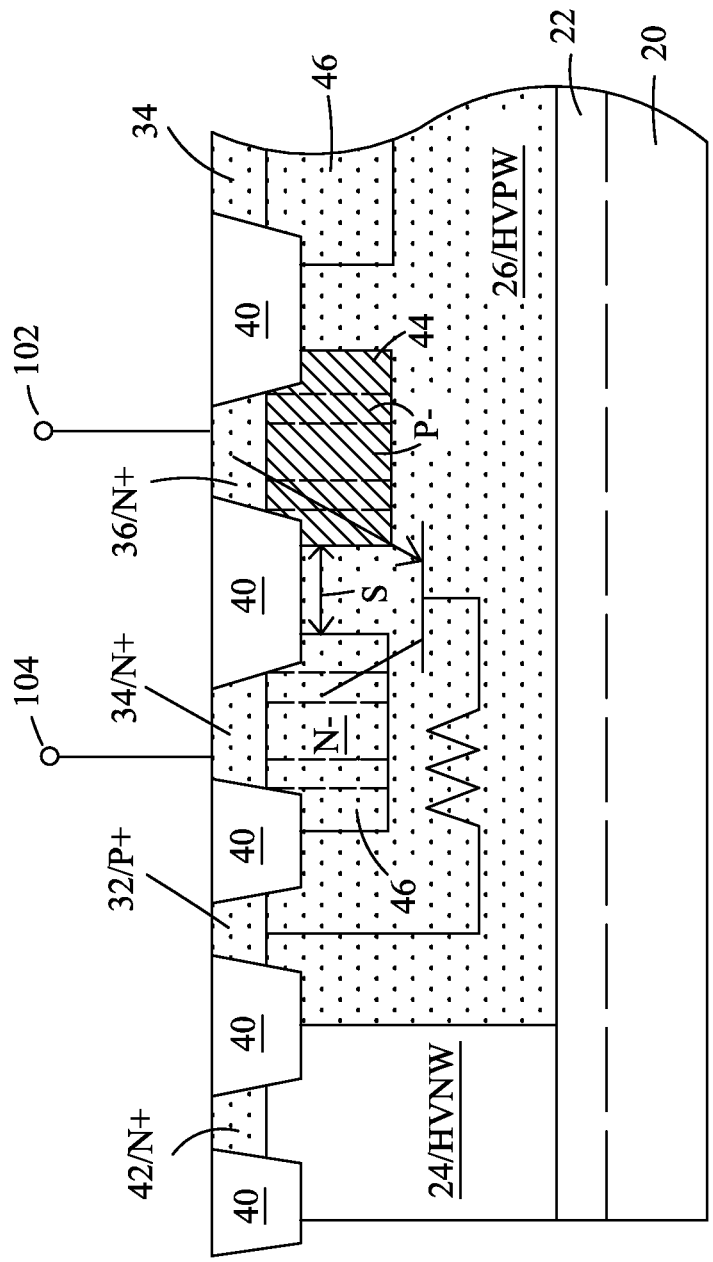
FIG. 5 illustrates a cross-sectional view of an ESD device in accordance with various alternative embodiments, wherein the ESD device comprises a NPN BJT.

Although the above-discussed embodiments provide a method of forming an ESD device comprising a PNP BJT, one skilled in the art will realize that the teaching provided the disclosure is readily available for the formation of an ESD device comprising an NPN BJT, with the conductivity types of the respective base pick-up region 32, collector 34, and emitter 36 inverted. FIG. 5 illustrates a cross-sectional view of an ESD device comprising an NPN BJT, with the conductivity types of regions 24, 26, 32, 34, 36, 42, 44, and 46 inverted from the respective regions shown in FIGS. 1A through 1C. Furthermore, dotted lines are drawn to mark the possible positions of the side edges of regions 44 and 46, which positions may be essentially the same as shown in FIGS. 1A through 1C.

In accordance with embodiments, an ESD device includes an HVW region of a first conductivity type; a first heavily doped region of a second conductivity type opposite the first conductivity type over the HVW region; and a doped region of the first conductivity type contacting the first heavily doped region and the HVW region. The doped region is under the first heavily doped region and over the HVW region. The doped region has a first impurity concentration higher than a second impurity concentration of the HVW region and lower than a third impurity concentration of the first heavily doped region. The ESD device further includes a second heavily doped region of the second conductivity type over the HVW region; and a third heavily doped region of the first conductivity type over and contacting the HVW region.

In accordance with other embodiments, an ESD device includes a BJT, which includes an HVNW region forming a part of a base of the BJT; an emitter over the HVNW region; and a doped region of n-type between and overlapping at least a portion of each of the emitter and the HVNW region. The doped region contacts the emitter and the HVNW region. The BJT further includes a collector over the HVNW region. The emitter and the collector are at substantially a same level. A base pick-up region is over and contacts the HVNW region.

In accordance with yet other embodiments, an ESD device includes a BJT, which includes an HVPW region forming a part of a base of the BJT; an emitter over the HVPW region; and a doped region of p-type contacting the emitter and the HVPW region. The doped region is under the emitter and over the HVPW region. The BJT further includes a collector over the HVPW region. The emitter and the collector are at substantially a same level. A base pick-up region is over and contacts the HVPW region.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   an Electrostatic Discharge (ESD) device comprising:
   a first High-Voltage Well (HVW) region of a first conductivity type;
   a first heavily doped region of a second conductivity type opposite the first conductivity type over the first HVW region;
   a first doped region of the first conductivity type contacting the first heavily doped region and the first HVW region, wherein the first doped region is under the first heavily doped region and over the first HVW region, and wherein the first doped region has a first impurity concentration higher than a second impurity concentration of the first HVW region and lower than a third impurity concentration of the first heavily doped region;
   a second heavily doped region of the second conductivity type over the first HVW region;
   a first insulation region between and contacting the first heavily doped region and the second heavily doped region; and
   a second insulation region contacting the first heavily doped region, wherein the first insulation region and the second insulation region contact opposite sidewalls of the first heavily doped region, wherein the first heavily doped region has a first width, and the first dope region has a second width equal to or smaller than the first width, and wherein the first width and the second width are measured in a direction pointing from the first insulation region to the second insulation region.

2. The device of claim 1 further comprising a second doped region of the second conductivity type contacting the second heavily doped region and the first HVW region, wherein the second doped region is under the second heavily doped region and over the first HVW region, and wherein the second doped region has an impurity concentration higher than the second impurity concentration and lower than an impurity concentration of the second heavily doped region.

3. The device of claim 2, wherein the first and the second doped regions are spaced apart from each other by a portion of the first HVW region, and wherein side edges of the first and the second doped regions contact side edges of the portion of the first HVW region.

4. The device of claim 1, wherein the first heavily doped region is electrically connected to a VDD power supply line, and the second heavily doped region is electrically connected to a VSS power supply line.

5. The device of claim 1, wherein the first heavily doped regions are electrically connected to an input/output pad and the second heavily doped region is electrically connected to a VSS power supply line.

6. The device of claim 1, wherein the first heavily doped region is electrically connected to a VDD power supply line and the second heavily doped region is electrically connected to an input/output pad.

7. The device of claim 1, wherein the first HVW region and the first doped region form an interface substantially perpendicular to a major surface of a semiconductor substrate, and wherein the semiconductor substrate is under the ESD device.

8. The device of claim 1, wherein the first conductivity type is n-type, and the second conductivity type is p-type.

9. The device of claim 1, wherein the first conductivity type is p-type, and the second conductivity type is n-type.

10. The device of claim 1 further comprising a third heavily doped region of the first conductivity type over and contacting the first HVW region, wherein the third heavily doped region forms a first ring encircling the first and the second heavily doped regions, wherein the device further comprises a second HVW region forming a second ring encircling the first ring and the first HVW region, and wherein the second HVW region is of the second conductivity type.

11. The device of claim 1, wherein the second width is equal to the first width.

12. The device of claim 1, wherein the second width is smaller than the first width.

13. A device comprising:
an Electrostatic Discharge (ESD) device comprising a bipolar junction transistor (BJT), wherein the BJT comprises:
a High-Voltage N-Well (HVNW) region forming a part of a base of the BJT;
an emitter over the HVNW region;
a first doped region of n-type between and overlapping at least a portion of each of the emitter and the HVNW region, wherein the first doped region contacts the emitter and the HVNW region; and
a collector over the HVNW region, wherein the emitter and the collector are at substantially a same level; and
an insulation region between and contacting the collector and the emitter, wherein the first doped region extends under, and vertically overlapping a portion of, the insulation region.

14. The device of claim 13, wherein the first doped region has an impurity concentration higher than an impurity concentration of the HVNW region and lower than an impurity concentration of the emitter.

15. The device of claim 13, wherein the first doped region has a horizontal dimension substantially equal to or smaller than a respective horizontal dimension of the emitter.

16. The device of claim 13, wherein connections of the emitter and the collector are selected from the group consisting essentially of:
the emitter and the collector are electrically connected to a VDD power supply line and a VSS power supply line, respectively,
the emitter and the collector are electrically connected to an input/output pad and a VSS power supply line, respectively, and
the emitter and the collector are electrically connected to a VDD power supply line and an input/output pad, respectively.

17. The device of claim 13 further comprising a second doped region of p-type between and contacting the collector and the HVNW region, wherein the second doped region has an impurity concentration lower than an impurity concentration of the collector and higher than an impurity concentration of the HVNW region, and wherein the emitter and the collector comprise edges facing each other and spaced apart from each other by a portion of the HVNW region.

18. A device comprising:
an Electrostatic Discharge (ESD) device comprising a bipolar junction transistor (BJT), wherein the BJT comprises:
a High-Voltage P-Well (HVPW) region forming a part of a base of the BJT;
an emitter over the HVPW region;
a first doped region of p-type contacting the emitter and the HVPW region, wherein the first doped region is under the emitter and over the HVPW region; and
a collector over the HVPW region, wherein the emitter and the collector are at substantially a same level; and
an insulation region between and contacting the collector and the emitter, wherein the first doped region extends under and vertically overlapping a portion of the insulation region.

19. The device of claim 18, wherein the first doped region has an impurity concentration higher than an impurity concentration of the HVPW region and lower than an impurity concentration of the emitter.

20. The device of claim 18, wherein connections of the emitter and the collector are selected from the group consisting essentially of:
the emitter and the collector are electrically connected to a VSS power supply line and a VDD power supply line, respectively,
the emitter and the collector are electrically connected to an input/output pad and a VDD power supply line, respectively, and
the emitter and the collector are electrically connected to a VSS power supply line and an input/output pad, respectively.

21. The device of claim 18 further comprising a second doped region of n-type between and contacting the collector and the HVPW region, wherein the second doped region has an impurity concentration higher than an impurity concentration of the collector and lower than an impurity concentration of HVPW region, and wherein emitter and the collector comprise edges facing each other and spaced apart from each other by a portion of the HVPW region.

* * * * *

UNITED STATES PATENT AND TRADEMARK OFFICE
CERTIFICATE OF CORRECTION

PATENT NO.        : 8,598,625 B2  
APPLICATION NO.   : 13/091468  
DATED             : December 3, 2013  
INVENTOR(S)       : Hsi-Yu Kuo Page 1 of 1

It is certified that error appears in the above-identified patent and that said Letters Patent is hereby corrected as shown below:

In the Claims

In Col. 6, line 38, claim 1, delete "dope" and insert --doped--.

Signed and Sealed this  
Fourth Day of February, 2014

Michelle K. Lee  
*Deputy Director of the United States Patent and Trademark Office*